United States Patent [19]

Kato et al.

[11] 4,410,408

[45] Oct. 18, 1983

[54] METHOD OF PREPARING ZINC OXIDE FILM

[75] Inventors: Suehiro Kato, Nagaokakyo; Kenji Ando, Kyoto, both of Japan

[73] Assignee: Murata Manufacturing Company, Ltd., Japan

[21] Appl. No.: 337,081

[22] Filed: Jan. 5, 1982

[30] Foreign Application Priority Data

Jan. 12, 1981 [JP] Japan ................................. 56-3567

[51] Int. Cl.$^3$ ............................................. C23C 15/00
[52] U.S. Cl. ............................................. 204/192 SP
[58] Field of Search .................. 204/192 PE, 192 SP, 204/192 C

[56] References Cited

U.S. PATENT DOCUMENTS 4,336,120  6/1982  Sakakura et al. ............. 204/192 SP

OTHER PUBLICATIONS

Mamio et al., Vertical Electrode Configuration to Avoid Contaminating Particles in Sputtered ZnO Thin Film, Vacuum, vol. 28, No. 12, pp. 529–532, 1978.

Ohji et al., New Sputtering System for Manufacturing ZnO Thin–Film SAW Devices, J. Vac. Sci., Technol. 15(4) Jul./Aug. 1978, pp. 1601–1604.

*Primary Examiner*—G. L. Kaplan
*Assistant Examiner*—Nam X. Nguyen
*Attorney, Agent, or Firm*—Ostrolenk, Faber, Gerb & Soffen

[57] ABSTRACT

A method of making zinc oxide film comprises the steps of forming a zinc oxide layer on a substrate by carrying out radio-frequency sputtering with a target of zinc oxide, forming a zinc oxide layer on said zinc oxide layer by carrying out reactive, direct-current or radio-frequency sputtering with a target of zinc metal.

6 Claims, No Drawings

METHOD OF PREPARING ZINC OXIDE FILM

BACKGROUND OF THE INVENTION

1. Field of the Invention

This invention relates to a method of preparing zinc oxide films and, more particularly, to a method for making zinc oxide films which are utilizable as piezoelectric films.

2. Description of the Prior Art

Zinc oxide films have been used as piezoelectric films for surface acoustic wave filters, vibrators, resonators and the like. For example, zinc oxide films are applied to surface acoustic wave filters in which a zinc oxide film is excited by transducing electrodes and surface acoustic waves are generated in the film. In order to generate desired surface acoustic waves, the film is generally required to have a thickness greater than a half wave length ($\frac{1}{2}\lambda$) of the surface acoustic wave to be generated.

So far, such zinc oxide films have been produced by carrying out radio-frequency sputtering with a target of zinc oxide. In such a conventional method, a rate of formation of the film is very low and, for example, of the order of about 1 μm per hour. Thus, when a zinc oxide film with a 25 μm thick is to be produced, it takes about 25 hours. This results in the considerable increase of a manufacturing cost of surface acoustic wave transducers.

SUMMARY OF THE INVENTION

It is therefore an object of the present invention to provide a method of making zinc oxide films, which makes it possible to produce zinc oxide film with a high rate of formation.

Another object of the present invention is to provide a method of making zinc oxide films, which makes it possible to produce zinc oxide films having excellent adhesion properties with a high rate of formation.

According to the present invention, there is provided a method of making zinc oxide films comprising the steps of forming a zinc oxide layer on a substrate by carrying out radio-frequency sputtering with a target of zinc oxide, and forming a zinc oxide layer on said zinc oxide layer by carrying out reactive, direct-current or radio-frequency sputtering with a target of zinc metal.

When zinc oxide films are applied to surface acoustic wave filters, an insulating material such as glass, ceramics and the like are used as a substrate on which a zinc oxide film of a multi-layer construction is formed. When zinc oxide films are applied to tuning-fork type vibrators, or plate-like vibrators, a metal such as elinvar is used as a substrate.

In the method of the present invention, the first layer of the zinc oxide film is formed on the substrate by radio-frequency sputtering from a target of a zinc oxide ceramics. The step of forming this first layer of zinc oxide film is almost the same as the method of making zinc oxide film of the prior art. The thickness of this first layer is determined according to the whole thickness of the zinc oxide film including the second layer. In the preferred embodiment, the thickness of the first layer is selected within the range from 5,000 Å to 8 μm. It is, however, to be noted that the thickness of the first layer is never limited to the values within the above range. This first layer of the zinc oxide film is provided to ensure good adhesion of the zinc oxide film to the substrate surface. According to the step of forming the first layer, there is provided a zinc oxide film with good crystallizability. This first zinc oxide layer has good c-axis orientation with respect to the substrate surface, and is excellent in density and adhesion properties.

The step of forming the first layer of zinc oxide film may be carried out, for example, in the following manner: A target consisting essentially of zinc oxide is prepared by the process generally used for preparation of ceramics. For example, the target is prepared by forming powder of zinc oxide into a desired shape, and then firing the same in air. The target of zinc oxide is mounted on an anode arranged in a bell jar of a radio-frequency sputtering apparatus, and a substrate is mounted on the cathode arranged opposite to the anode. After making it airtight, the bell jar is evacuated to a pressure of about $1 \times 10^{-6}$ Torr, and then supplied with a mixed gas consisting of 80 to 90 vol.% of argon and 20 to 10 vol.% of oxygen, whereby adjusting the pressure in the bell jar to $1 \times 10^{-1}$ to $1 \times 10^{-3}$ Torr. A radio-frequency voltage is applied between the cathode and anode by a radio-frequency electric power source with a frequency of 13.56 MHz, and an electric power of about 6 w/cm² is supplied to the target. The first layer of zinc oxide film is formed on the substrate.

After forming the first layer of zinc oxide, the second layer of zinc oxide is formed on the first zinc oxide layer by the reactive direct-current sputtering method or reactive radio-frequency sputtering method, using a target of zinc metal.

When zinc metal is used as the target for sputtering, the rate of formation of the zinc oxide film is increased to about 10 μm per hour. In order to convert zinc metal into zinc oxide, it is required to carry out the reactive sputtering. This reactive sputtering is achieved by carrying out the sputtering in an oxidizing atmosphere such as, for example, in a mixed gas of 50 to 90 vol.% of argon and 10 to 50 vol.% of oxygen. During sputtering, zinc atoms, sputtered from the target as the result of the bombardment of argon ions, reacts with the oxygen atoms and is converted into zinc oxide which is deposited on the first layer of zinc oxide film to form the second layer of the zinc oxide film.

The reasons why the argon and oxygen gases are in the above mixed ratio is that if argon is less than 50 vol.% or if oxygen exceeds 50 vol.%, the rate of formation of the film slows down, thus making it impossible to accomplish the object of the present invention, and that if argon exceeds 90 vol.% or if oxygen is less than 10 vol.%, the conversion of zinc into zinc oxide would not take place sufficiently, thus making it difficult to form the second layer of zinc oxide film.

The step of forming the second layer of zinc oxide may be carried out, for example, in the following manner with the reactive direct-current sputtering method.

A metal plate of zinc is used as a target and mounted on the cathode arranged in the bell jar of the direct-current sputtering apparatus. A substrate with the first layer of zinc oxide is mounted on the anode arranged opposite to the cathode. The bell jar is made airtight, then evacuated to a vacuum of $1 \times 10^{-6}$ Torr, and supplied with a mixed gas of argon and oxygen to adjust the atmosphere and the pressure to $1 \times 10^{-1}$ to $5 \times 10^{-5}$ Torr. A direct-current voltage is applied between the cathode and anode. The voltage and current supplied are determined within the range of 1 to 7 KV/DC and the range of 0.15 to 1.5 mA/cm², respectively. By this treatment, the second layer of zinc oxide film is formed on the first zinc oxide layer and a multi-layer zinc oxide film is obtained. In the above second step, the rate of formation of the zinc oxide film can be controlled by adjusting the voltage and the current within the above respective ranges, and considerably increased up to about 10 μm per hour as compared with the rate of formation of the first layer of zinc oxide film.

As the step of forming the second layer of zinc oxide film, it is possible to use the radio sputtering method. In such a case, a target consisting of zinc metal is also employed and the sputtering is carried out in an atmosphere in which the reactive sputtering can occur, i.e., in an atomosphere containing oxygen.

In the foregoing, the formation of the first and second layers of the zinc oxide film is separately carried out by using separate sputtering apparatus, but it is possible to form these layers in order by means of a continuous sputtering apparatus. It is also possible to use the aforesaid sputtering methods together with the magnetron sputtering method, in which a magnetron is used.

According to the present invention, the time required for the formation of zinc oxide film with a desired thickness can be reduced considerably as compared with the prior art. For example, when preparing a zinc oxide film with a 25 μm thick, the time can be reduced by about one-third after the following manner: The first layer of zinc oxide with a 5 μm thick is formed by carrying out the radio-frequency sputtering for about 5 hours, and then the second layer of zinc oxide with a remaining thickness is formed by carrying out the reactive, direct-current or radio-frequency sputtering for about 2 hours.

Since the first layer of zinc oxide film is formed by using the target of zinc oxide and the radio-frequency sputtering, it is possible to obtain a zinc oxide film with good quality, good crystallizability and high adhesion properties. The second layer of the zinc oxide film formed on the first zinc oxide layer do not interfere with the piezoelectric function of the zinc oxide film, and functions as an integral part of the zinc oxide film.

What we claim is:

1. A method of making zinc oxide film comprising the steps of forming a first zinc oxide layer on a substrate by radio-frequency sputtering of zinc oxide from a target of zinc oxide and then forming a second zinc oxide layer on said first zinc oxide layer by reactive direct-current or radio-frequency sputtering of zinc from a target of zinc metal in an oxidizing atmosphere.

2. The method of claim 1 wherein the oxidizing atmosphere consists essentially of 50 to 90 volume percent of argon and 10 to 50 volume percent of oxygen.

3. The method of claim 2 wherein the reactive direct-current or radio-frequency sputtering of zinc is effected at a pressure of $10^{-1}$ to $5 \times 10^{-4}$ Torr.

4. The method of claim 3 wherein the second zinc oxide layer is formed by reactive direct-current sputtering at a voltage of 1–7 KV and a current of 0.15 to 1.5 mA/cm$^2$.

5. The method of claim 4 wherein the first zinc oxide layer is formed at a pressure of $10^{-1}$ to $10^{-3}$ Torr.

6. The method of claim 5 wherein the first zinc oxide layer is formed by radio-frequency sputtering of zinc oxide in an atmosphere consisting essentially of 80–90 volume percent argon and 20–10 volume percent oxygen.

* * * * *